United States Patent [19]

Bolger

[11] Patent Number: 5,454,879
[45] Date of Patent: Oct. 3, 1995

[54] HELICALLY GROWN MONOLITHIC HIGH VOLTAGE PHOTOVOLTAIC DEVICES AND METHOD THEREFOR

[76] Inventor: Stephen R. Bolger, 127 W. 79th St., Apt. 11 J, New York, N.Y. 10024

[21] Appl. No.: 210,038

[22] Filed: Mar. 17, 1994

[51] Int. Cl.[6] .......................... H01L 31/058; H01L 31/18
[52] U.S. Cl. .......................... 136/253; 136/244; 136/258; 136/261; 117/15; 117/16; 117/25; 264/171.2; 437/2; 437/51; 437/115; 437/118
[58] Field of Search ...................... 117/15, 16, 25; 264/173, 177.14, 209.1; 437/2–5, 51, 115, 118; 136/244, 253, 258 PL, 261

[56] References Cited

U.S. PATENT DOCUMENTS

| | | | |
|---|---|---|---|
| 3,422,527 | 1/1969 | Gault | 437/2 |
| 4,229,231 | 10/1980 | Witt | 437/113 |
| 4,309,239 | 1/1982 | Rodot née Fumeton | 117/15 |
| 4,363,769 | 12/1982 | Tsuya et al. | 264/85 |
| 4,515,650 | 5/1985 | Chaudhari et al. | 117/27 |
| 4,523,966 | 6/1985 | Tsuya et al. | 437/118 |
| 4,682,206 | 7/1987 | Tsuya et al. | 257/64 |
| 5,106,763 | 4/1992 | Bathey et al. | 437/2 |

Primary Examiner—Aaron Weisstuch
Attorney, Agent, or Firm—Samuels, Gauthier & Stevens

[57] ABSTRACT

The invention provides for methods that include the steps of continuous liquid phase epitaxy followed by evaporation or implantation of dopant, barrier-interconnect, and additional interconnect-dopant layers to grow cylindrical helical multi-layer structures which form long series chains of photocells when sliced, etched, and passivated. The invention also provides for uniquely formed photovoltaic devices fabricated by the method, as well as the use of such devices as infrared photovoltaic generators using radiation from a local thermal source or reservoir.

17 Claims, 2 Drawing Sheets

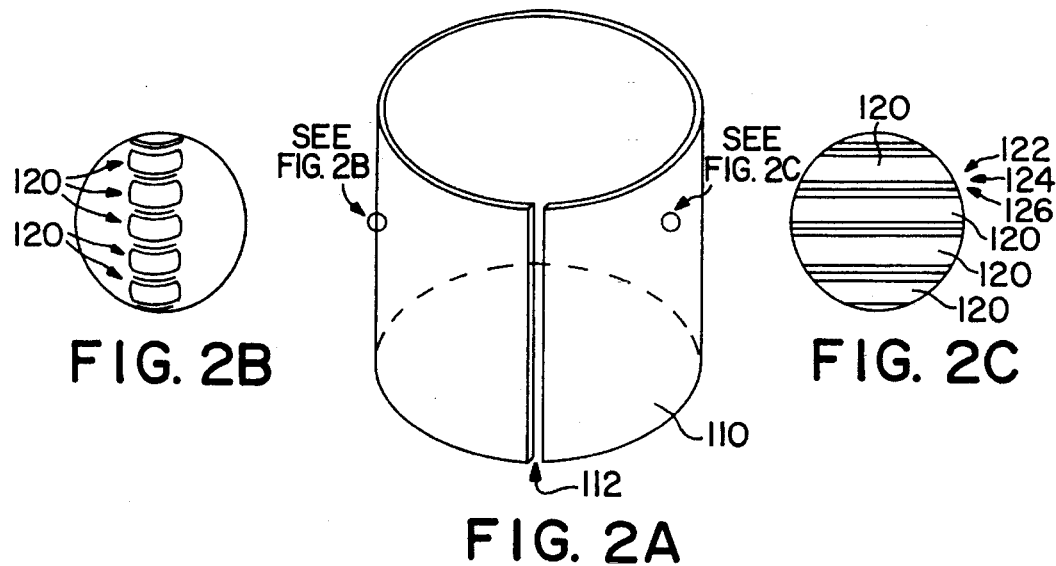
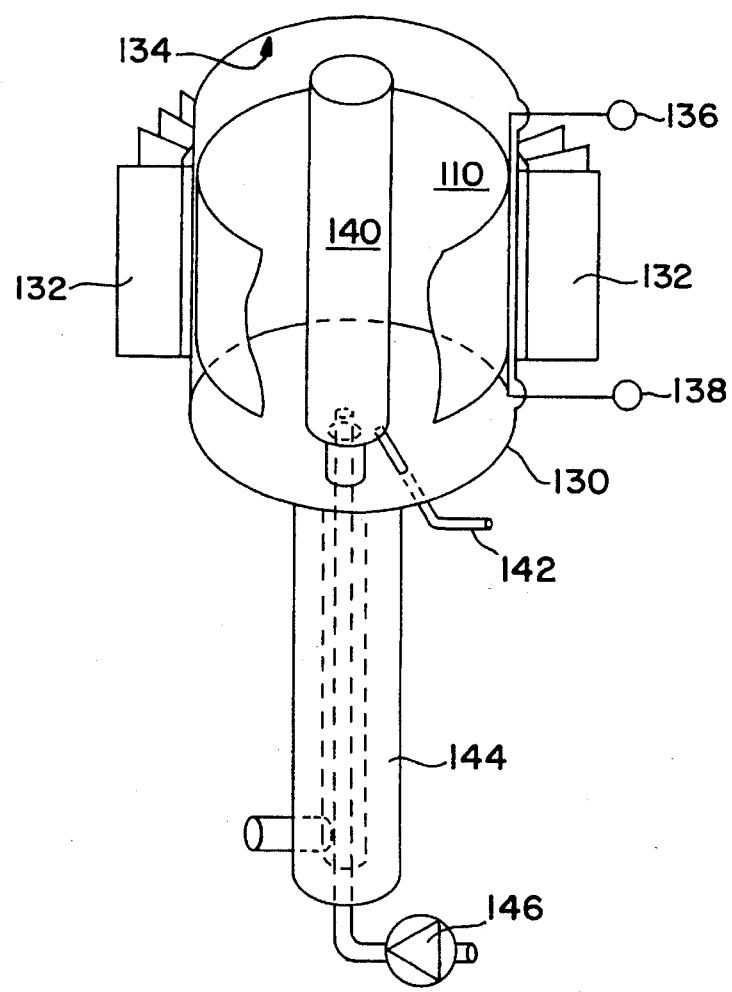

5,454,879

HELICALLY GROWN MONOLITHIC HIGH VOLTAGE PHOTOVOLTAIC DEVICES AND METHOD THEREFOR

BACKGROUND OF THE INVENTION

The photovoltaic effect is well known and widely used in the conversion of radiant energy to electricity. Present photovoltaic devices are generally constructed as large area planar semiconducting P-N junctions that receive illumination at incidence normal to the plane of the junction. Individual photocells can produce large currents under intense illumination, but only at low voltage, typically 65% of the band-gap of the semiconductor. Losses due to resistance are significant in such devices, as are losses due to undesirable low energy photon absorption in the high field region of the planar junction.

SUMMARY OF THE INVENTION

The present invention provides for a method of growing high quality crystalline semiconducting photovoltaic piles or castings that accept illumination at incidence parallel to the junctions. Devices made according to the method of the invention can easily produce hundreds of volts at substantial currents with negligible internal resistance and minimal absorption of sub-band-gap radiant energy. Such devices are well suited for applications involving high degrees of solar concentration as well as applications involving sources of infra-red radiant energy.

In accordance with the invention, a method is provided for pulling high quality crystal that matches a seed crystal from a melt by float liquid phase epitaxy. The method may employ a rotary screw based mechanism to pull crystal in a cylindrical form incorporating a helical layering of materials that comprises a deep pile of photocells when annealed, suitably sliced, etched, and passivated. The pile typically consists of multiple series of connected photocells, each only a fraction of a millimeter thick, that collectively produce high voltage when illuminated at incidence substantially parallel to the planes of the incorporated junctions.

Photovoltaic devices made in accordance with the present invention may consist of a weakly P-doped bulk material in which radiant energy is absorbed, layered with a thin strongly doped N-type minority carrier extraction layer. Doping concentration may be made higher at the back surface to reflect minority carriers and improve ohmic contact to a metal electrode. Similarly, doping concentration may be made higher at the front surface to reduce resistivity and improve ohmic contact to the electrode. Minority carrier lifetime should be maximized to attain satisfactory performance. This requires materials of greatest purity grown with a maximum of crystalline order, or with passivation of defects.

BRIEF DESCRIPTION OF THE DRAWINGS

The following description of an embodiment of the invention may be further understood with reference to the accompanying drawings in which:

FIGS. 2A–2C are diagrammatic views of a photovoltaic device made in accordance with a method of the invention; and FIG. 3 is a diagrammatic view of the device shown in FIG. 2 in use in a photovoltaic system.

DETAILED DESCRIPTION OF THE ILLUSTRATED EMBODIMENT

Figure 1:
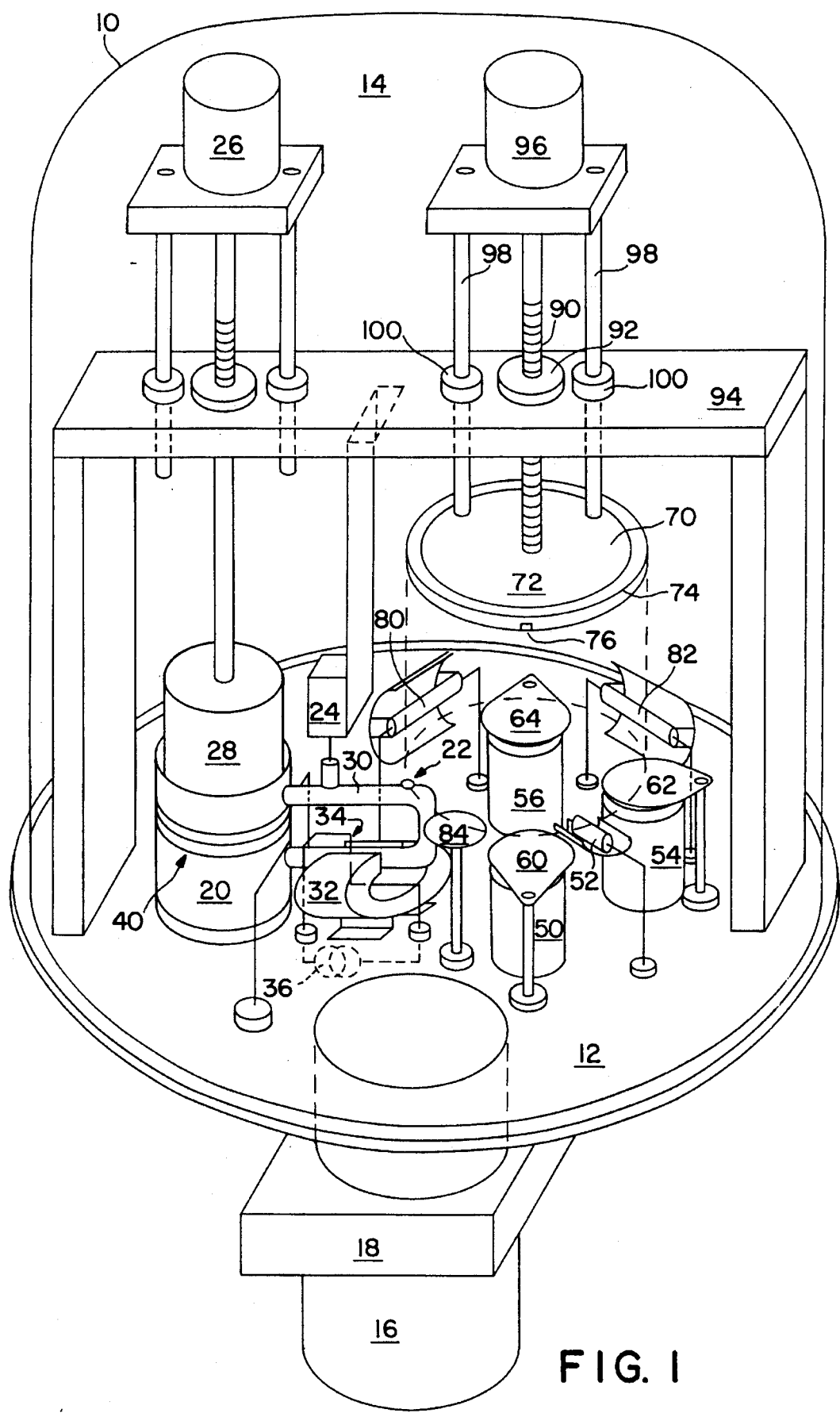
FIG. 1 is diagrammatic view of a system for carrying out the method of the invention.

The embodiment of the invention described below is suitable for integration with a thermal radiation source. Methods in accordance with the invention are also suitable for applications involving more conventional solar based systems.

Photocell design begins with analysis of the energy spectrum of the radiant energy source, and is primarily a function of the source temperature. For example, the sun is described as a black body emitter at 6050° K., and according to Planck's radiation law, its peak of radiation intensity corresponds to an energy of 2.5 electron volts per photon and the median energy of the radiation corresponds to about 1.4 electron volts per photon. The most efficient solar cell semiconductors have band gaps near the median of the energy spectrum. Practical thermal energy storage involves temperatures restricted to the order of 2000° K. due to the limitations of engineering materials. A black body at this temperature has its peak of radiation spectrum corresponding to about 0.82 electron volts per photon.

Unlike the case with solar radiation, thermal radiation of sub band gap energy that is not absorbed in the thermal photovoltaic device can be reflected back to the thermal emitter. Thus, a semiconductor with a band gap closer to the peak of the energy intensity spectrum more efficiently captures the available radiant energy. Germanium is nearly ideal for thermal photovoltaics, with a band gap equal to 0.66 electron volts and excellent carrier mobility. It is also available at very high purity and is relatively easy to grow at moderate temperatures. The embodiment herein described employs germanium, but the same methods and materials generally apply to silicon as well. The method may also be applied to other semiconductors, but the dopants and interface layers will differ, and the process may not require the use of a vacuum.

As shown in FIG. 1, a growth method of the invention involving germanium is conducted under vacuum. A bell jar 10 placed on a base plate 12 defines the evacuated volume 14. A cryopump 16 evacuates the apparatus to a base pressure on the order of $1 \times 10^{-7}$ torr. A valve 18 isolates the cryopump 16 when the bell jar 10 is open. Turbomolecular and other vacuum pumping methods may be substituted for the cryopump.

The system includes a molten germanium reservoir 20 in communication with a germanium mixing loop 30 having an aperture 22. The aperture 22 as well as an arsenic sublimation source 50, a radiant heater 52, a titanium evaporation source 54, and an aluminum evaporation source 56, are all placed in a circular arrangement under a platter 70. The platter 70 comprises a support disk 72 holding a pre-form 74. The disk 72 is 29.75 centimeters in diameter and made of graphite. The 30 centimeter diameter pre-form 74 is cast of polycrystalline germanium. Generally, the pre-form is made of the semiconductor to be grown to avoid stress cracking as temperature changes. The photovoltaic pile will be grown upon its 1 millimeter wide lower edge. The pre-form 74 hangs loosely from disk 72 to allow for thermal expansion. Crystal growth will be initiated from a seed of germanium 76 placed into the pre-form 74. Radiant heaters 80 and 82 warm the pre-form to process temperature, in the range from 400°–500° C. to grow germanium. A sputter etch station 84 provides a means to atomically clean the seed crystal prior to the start of growth.

A jackscrew 90 is firmly attached to the support disk 72 such that the two elements rotate together. The jackscrew 90 rotationally engages a threaded collar 92 affixed to a support beam 94. The jackscrew thread has the same pitch as the intended thickness of each cell in the photopile, typically 0.2 to 0.3 millimeters per turn, as limited by the mobility and lifetime of minority carriers in the semiconductor. A geared motor 96 turns the jackscrew at rates in the range from 0.32 to 3.2 RPM to move the lower edge of the pre-form past the deposition sources at a linear speed in the range from 0.5 to 5 centimeters per second as the jackscrew 90 cranks upwards through the threaded collar 92.

The finished photopile will comprise a hollow cylinder 30 centimeters in diameter, 30 centimeters long, and have walls 1 millimeter in thickness incorporating 1200 series cells each 0.25 millimeter thick along the axial direction. It will generate over 500 volts open circuit under infrared radiation from a 2000° K. thermal source.

The jackscrew 90 supports geared motor 96 which causes the jackscrew 90 to rise as the jackscrew rises by engagement of threads and jackscrew 90 with collar 92. Guide rods 98 engaging linear bearings 100 in support beam 94 prevent the motor housing from rotating yet permit the motor 96 to rise with the jackscrew. These mechanisms are carefully made to suppress vibration and jerky motion.

The germanium source 20 incorporates means to accurately maintain the level of liquid germanium at aperture 22 where a meniscus will engage and feed the growing photopile. Level sensor 24 controls a motor 26 that drives a displacer piston 28 into the reservoir of molten germanium to hold the level constant as germanium is consumed by the growth process. The displacer piston 28, the germanium reservoir 20, and the mixing loop 30 are made of fused quartz. The mixing loop 30 circulates the molten germanium enabling it to be maintained at a substantially uniform temperature. A faraday effect pump comprised of a magnet 32, tungsten electrodes 34, and a current source 36 drives the circulation. An induction heating coil 40 heats the germanium in reservoir 20 to maintain its temperature at approximately 950° C., just above the 937° C. melting point. The initial charge of polycrystalline solid germanium is semiconductor or solar grade pure and doped with boron to a concentration of $1.0\times10^{16}$ acceptors per cubic centimeter. Insulation (not shown) should enclose the reservoir and circulation loop.

The aperture 22 defines the size and shape of the germanium meniscus, and thus strongly influences the wall thickness of the growing cylinder. In order to form a convex meniscus, it must be made in a material that is not wetted by the melt, i.e., fused quartz. The temperature in the growth region and the speed of platter rotation also influence wall thickness and crystal quality. These are carefully controlled throughout the growth process.

To assure that the germanium will nucleate on the seed crystal and not elsewhere, the lower edge of the pre-form is pre-coated with a layer of aluminum approximately 500 nanometers thick. Aluminum melts at 660° C. When it briefly contacts the molten germanium at 950° C. the aluminum melts to create a liquid interface between the freezing germanium and the previously grown layer. This allows the growing crystal to follow the orientation of the seed without interference by nucleation at the interface. This momentarily molten aluminum interface between the growing crystal and the previously grown layer of the photopile will be maintained throughout the growth process. The initial aluminum layer will serve as one of the two end contacts of the photopile.

After temperatures and other source rates are established with closed shutters, the growth is commenced by positioning the seed crystal 76 over the aperture 22 at the starting height, then raising the germanium meniscus in aperture 22 to meet the seed, using the displacer piston in the germanium reservoir. When the molten germanium meniscus contacts the seed, the motor 96 is started to begin the growth process. Crystal growth then proceeds from the seed along the lower edge of the pre-form 74 as the platter 70 rotates with the jackscrew 90. Then motor 26 drives the displacer piston 28 through another jackscrew mechanism responsive to the output of a level sensor 24 to maintain the germanium meniscus at constant level as the material is consumed.

At the precise moment that the seed crystal first arrives over the arsenic sublimation source 50, a shutter 60 opens to allow arsenic deposition onto the layer of germanium just grown. The deposition rate is set by controlling the temperature of the sublimation source to deposit arsenic onto the end of the growing cylinder to dope the surface 100 nanometers of the germanium layer to an average concentration of $1.0\times10^{17}$ donors per cubic centimeter. The arsenic impurity is then driven in and activated by passage of the layer past the radiant heater 52, which briefly heats the passing surface close to the melting point to form the P-N junction which extracts the minority photoelectrons from the P-type germanium. The arsenic source 50 and the radiant heater 52 could be replaced by a low voltage high current ion implanter to improve the purity and penetration of the donor doping.

When the seed 76 first passes over the titanium source 54, a shutter 62 opens to begin deposition of the inter-cell metallic contact and diffusion barrier layer. The titanium forms an ohmic contact with the heavily N-doped germanium at the surface of the just-grown layer. The titanium source, which may be a filament evaporator, is set to deposit a layer of the material 250 nanometers thick over the N-type germanium. Because titanium melts at 1660° C., the layer never comes close to melting in the subsequent processing. It thus provides a diffusion barrier to prevent P-type compensation of the N layer by the next layer to be deposited, i.e., aluminum. It also serves as the inter-cell electrode.

When the seed reaches the aluminum source 56, again a filament evaporator, a shutter 64 opens to allow aluminum deposition. The deposition rate is set to apply 100 to 200 nanometers of aluminum over the previously applied titanium layer. The aluminum provides a good ohmic contact to P-type germanium. It is also an acceptor that forms an increased concentration doping layer at the contact to reflect minority carriers in the next germanium layer to be grown when it melts to allow the next germanium layer to follow the established crystalline order.

Once past the aluminum source the edge of the growing photopile is ready to pass through the germanium meniscus again to begin growth of the next cell-layer in the pile. All shutters remain open throughout the remaining processing as the growing end of the cylindrical photopile rotates, with each point upon it successively passing germanium, arsenic, radiant heater, titanium and aluminum sources to produce a helical sequence of four intermeshed layers. When the growth attains the desired number of layers, the shutters are closed in the same order they had been opened, leaving open the aluminum source to form the second electrode of the photopile. In alternative embodiments, the position of the meniscus could be moved under computer control to vary the cylindrical shape of the casting.

At this point the growth is complete. The finished cylinder is allowed to cool. After the vacuum chamber is vented and opened, the photopile and the pre-form are removed from the machine. The photopile is removed from the pre-form by cleaving or sawing for further processing.

The helical series of layers comprising the cylinder do not yet form a stack of photocells connected in series. Each set of layers is short-circuited to the adjacent layer sets through the helix. To remove this short, the cylinder is sliced lengthwise at the point of the original seed crystal as shown in FIG. 2A. The slice, designated at 112, through the cylinder 110 can also be made by laser. FIGS. 2B and 2C show enlarged views of the exterior and a cross section of the cylinder wall built of alternating layers of P-doped germanium 120, N compensated germanium 122, titanium 124, and aluminum 126. The thicknesses of the metal and dopant layers are exaggerated for clarity.

Once sliced, the cylinder is etched for 5-10 minutes in an aqueous nitric acid solution to remove damaged crystal near the slice and to overspray contaminated surfaces from inside and outside the cylinder. The cylinder may be further etched to be closer to the absorption depth of the incident photons. The cylinder must now be handled with great care to avoid dangerous shocks from the high voltage it generates upon exposure to light. After etching, the cylinder is washed in distilled water.

The method generally produces a reasonably good crystal, but hydrogen passivation of defects does improve performance. This is achieved by annealing the cylinder in a hydrogen atmosphere for several hours at 500° C. This is necessary when the crystal is poor quality, such as when it has been pulled too quickly.

To complete the processing, the end electrodes are masked by application of a resist and the whole of the cylinder surface is passivated on both surfaces by oxidation in a low temperature low pressure radio-frequency plasma process. An anti-reflection coating may also be applied. The photopile is ready to use after stripping the resist.

FIG. 3 shows the finished photopile 110 integrated into the wall of a dewar enclosure 130 surrounding a radiant energy source 140. The radiant energy source 140 is a hollow tungsten bulb 8.0 centimeters in diameter and 40 centimeters long. It is heated from within to 2000° K. by combustion of a fuel delivered via a fuel line 142. Air for combustion within the bulb passes through an energy conservation counterflow heat exchanger 144, forced at low pressure by a compressor 146. The dewar enclosure 130 incorporates an air cooled heat exchanger 132 to limit temperature rise in the photopile. An infrared transparent silicone grease conducts heat from the photopile to the dewar wall. The dewar enclosure includes a thin internal brightly reflective metalization layer 134. Electrodes 136 and 138 connect the photopile to an external electrical load, such as an electric motor or battery-charging system. The dewar enclosure is evacuated and permanently sealed.

The radiant heat source 140 provides infrared radiation that the photopile converts in part to electricity. Its surface area in the present embodiment is approximately 0.1 square meter. Assuming ideal black body behavior, it emits approximately 100 kilowatts of thermal radiation at 2000° K. About half of this is directly reflected back from the shiny interior of the dewar enclosure without intercepting the photopile. Of the remaining 50 kilowatts that the photopile intercepts, about 20%, or 10 kilowatts is converted to electricity. This produces 20 amperes of available current at 500 volts via electrodes 136 and 138. Another 20% is unavoidably absorbed as heat in the photopile, and this heat is transferred to the atmosphere via a heat exchanger 132. The remaining 30 kilowatts is radiation with too low an energy to be absorbed in the semiconductor, it is reflected back to the source by the metalized inner surface of the dewar enclosure.

The above described method of the invention provides for devices that produce very high voltage and significant power with only modest flow of current. This substantially eliminates loss due to electrical resistance. Further, the intimacy, large area and minimum thickness of the inter-cell connections almost entirely eliminates cell-to-cell resistance. In addition, the geometry of the device relative to the incident radiation allows most of the radiation of sub band gap energy to pass clear through the photopile without crossing a high field region where it is prone to be absorbed to deleterious effect. It can thus be recovered by reflection from the inner dewar surface. Combined, these advantages allow devices of the invention to attain very attractive thermal efficiencies relative conventional heat engines. The combustion heated infrared photopile generator described above produces enough power to propel a small car at almost 50% net thermal efficiency from a package enclosing fewer than 30 liters and weighing less than 20 kilograms.

The helical growth method of the invention may be used to form cylinders with thick walls as well as cylinders with the minimal wall thickness described above. In the case of thick walls, planar photopiles on the order of 1.0 millimeter thick can be sliced from the cylinder walls, then etched and passivated. These can be used wherever a planar geometry is more convenient. This would generally be the case when using silicon devices with a concentrated solar radiation source. Photopiles made according to this variation of the invention can usefully absorb very concentrated solar energy when adequately cooled. This allows large amounts of electricity to be extracted from a relatively small area of semiconductor, greatly reducing the cost of solar electricity. The cost of the concentrator becomes greater than the cost of the photovoltaic device. Helically grown planar cut photopiles also work particularly well when stacking cell planes of different band gap to improve spectral efficiency. Because the high-field junction planes are substantially parallel to the incident radiation, more low energy radiation passes through to the bottom of the stack where it can be usefully absorbed.

Those skilled in the art will appreciate that the general method of casting from a melt onto the edge of a rotational solid as described above has broad application outside of the field of casting crystalline helical photocell piles, and that numerous modifications may be made to the above embodiments without departing from the spirit and scope of the invention. For example, large rotational shells, such as aluminum boat hulls, may be cast under computer control without molds by controlling the horizontal radial position of a movable meniscus of the molten material to be cast as a jackscrew pulls the shape vertically from the melt. The material so cast may be of very high quality when the surrounding atmosphere is made inert.

I claim:

1. A method of making casting of a material in the form of a helix, said method comprising the steps of:

rotating a preform having a longitudinally extending axis about said axis;

placing said preform in material transfer relationship with a first, molten material via a meniscus of said molten material;

displacing said preform along said longitudinally extending axis in a direction away from said meniscus as said molten material is deposited onto said preform as a continuous helix.

2. A method as claimed in claim 1, wherein said method further includes the steps of:

containing said molten material in a reservoir; and maintaining said meniscus of said molten material at a constant level.

3. A method as claimed in claim 2, wherein said level of said meniscus is maintained responsive to the movement of a displacer piston in communication with said reservoir.

4. A method as claimed in claim 1, wherein said method further includes the step of circulating said molten material through a temperature controlled loop and thereby maintaining said material at a constant temperature.

5. A method as claimed in claim 1, wherein said method further includes the step of radially displacing said meniscus responsive to a computer controller as said pre-form rotates to vary the helical shape of said casting.

6. A method as claimed in claim 1, wherein said cast material is a semiconductor.

7. A method as claimed in claim 1, wherein said method further includes the steps of:

placing a second material in material transfer relationship with said preform, and depositing said second material onto said casting in a continuous layer such that said casting is formed of interleaved helices.

8. A method as claimed in claim 1, wherein said method further includes the steps of:

placing a third material in material transfer relationship with said preform, placing a fourth material in material transfer relationship with said preform, and depositing said third and fourth materials onto said casting in continuous layers such that said casting is formed of interleaved helices.

9. A method as claimed in claim 8, wherein said fourth material melts at a lower temperature than said first molten material thereby providing a liquid interface between successive layers of casting to facilitate crystalline growth following the orientation of a seed.

10. A method as claimed in claim 8, wherein said first molten material is a semiconductor material, said second material is a dopant material, said third material is a diffusion barrier material, and said fourth material is a metallic material.

11. A method as claimed in claim 8, wherein said method further includes the step of axially slicing said casting to form a plurality of photovoltaic devices connected in series.

12. A method as claimed in claim 11, wherein said method further includes the step of passivating crystal defects in said casting by annealing said casting in a hydrogen atmosphere.

13. A method as claimed in claim 11, wherein surface passivation is achieved by oxidation in a low temperature and low pressure plasma.

14. A generally helically shaped photovoltaic device having a plurality of discontinuous portions, each said discontinuous portion including a photovoltaic unit and said photovoltaic units being connected in series, wherein each said photovoltaic unit includes:

a layer of semiconductive material of first conductivity type, a layer of semiconductive material of second conductivity type, a layer of a diffusion barrier material, and a layer of a metallic material.

15. A photovoltaic device as claimed in claim 14, wherein said semiconductive material of first conductivity type is P doped germanium, said semiconductive material of second conductivity type is N compensated germanium, said diffusion barrier material is titanium, and said metallic material is aluminum.

16. A method of producing electricity from a photovoltaic device, wherein said method includes the steps of:

placing in an internally reflective enclosure a generally helically shaped photovoltaic device having a plurality of discontinuous portions, each said discontinuous portion including a photovoltaic unit and said photovoltaic units being connected in series, irradiating said device with radiant energy from a thermal source within said enclosure, and converting said radiant energy in said photovoltaic device to electricity.

17. A method as claimed in claim 16, wherein said radiant energy converted by said photovoltaic device is at least ten percent of the radiation irradiated by said thermal source.

* * * * *